(12) United States Patent
Jeong et al.

(10) Patent No.: US 8,339,424 B2
(45) Date of Patent: Dec. 25, 2012

(54) EMISSION DRIVER AND ORGANIC LIGHT EMITTING DISPLAY USING THE SAME

(75) Inventors: Seon-I Jeong, Suwon-si (KR); Mi-Hae Kim, Suwon-si (KR); Ki-Myeong Eom, Suwon-si (KR); Jin-Tae Jeong, Suwon-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 543 days.

(21) Appl. No.: 12/380,464

(22) Filed: Feb. 27, 2009

(65) Prior Publication Data

US 2009/0225068 A1 Sep. 10, 2009

(30) Foreign Application Priority Data

Mar. 4, 2008 (KR) .................. 10-2008-0020021

(51) Int. Cl.
*G09G 5/10* (2006.01)
*G09G 3/30* (2006.01)
(52) U.S. Cl. ................ 345/690; 345/76; 345/211
(58) Field of Classification Search .............. None
See application file for complete search history.

(56) References Cited

U.S. PATENT DOCUMENTS

| 5,454,018 | A | 9/1995 | Hopkins |
| 2006/0044230 | A1* | 3/2006 | Eom .................. 345/76 |
| 2007/0046608 | A1 | 3/2007 | Chung |
| 2007/0057877 | A1 | 3/2007 | Choi et al. |

FOREIGN PATENT DOCUMENTS

| EP | 1763003 | 3/2007 |
| JP | 2006-243174 A | 9/2006 |
| JP | 2006-243175 A | 9/2006 |
| JP | 2007-035188 | 2/2007 |
| JP | 2007-114476 A | 5/2007 |
| KR | 1020040078437 | 9/2004 |
| KR | 10-2005-0085414 | 9/2005 |
| KR | 10-2006-0031547 | 4/2006 |
| KR | 100646992 | 11/2006 |
| KR | 10-2007-0019463 | 2/2007 |
| KR | 1020070019463 | 2/2007 |
| KR | 10-2007-0100545 | 10/2007 |
| WO | WO 2007/013010 | 2/2007 |

OTHER PUBLICATIONS

European Search Report for corresponding European Patent Application No. 09154276.1 dated May 4, 2009.

Certificate of Patent for Invention dated Jun. 15, 2011 for Chinese Patent No. ZL200910008079.1 which shares priority of Korean Patent Application No. KR 10-2008-0020021 with captioned U.S. Appl. No. 12/380,464.

* cited by examiner

*Primary Examiner* — Christopher R Lamb
(74) *Attorney, Agent, or Firm* — Knobbe Martens Olson & Bear, LLP

(57) ABSTRACT

An organic light emitting display which prevents unnecessary illumination of the organic light emitting diodes is disclosed. The display has an emission driver which globally turns off all of the pixels during an initialization period, and allows normal operation during other times.

20 Claims, 6 Drawing Sheets

EMISSION DRIVER AND ORGANIC LIGHT EMITTING DISPLAY USING THE SAME

CROSS-REFERENCE TO RELATED APPLICATIONS

This application claims the benefit of Korean Patent Application No. 10-2008-0020021, filed on Mar. 4, 2008, in the Korean Intellectual Property Office, the entire content of which is incorporated herein by reference.

BACKGROUND

1. Field

The field relates to an emission driver and an organic light emitting display using the same, and more particularly to an emission driver and an organic light emitting display using the same for supplying a light emitting control signal to a light emitting control line.

2. Description of the Related Technology

Recently, various flat panel displays of reduced weight and volume, which are unfavorable in a cathode ray tube, have been developed. The flat panel display can take the form of, for example, a liquid crystal display, a field emission display, a plasma display panel and an organic light emitting display, etc.

The organic light emitting display displays an image using an organic light emitting diode (OLED) generating light by recombination of electrons and holes. The organic light emitting display has quick response speed and is driven with low power consumption. A general organic light emitting display supplies current corresponding to data signals to an organic light emitting diode using driving transistors formed in pixels to allow the organic light emitting diode to generate light.

Such a conventional organic light emitting display includes a data driver that supplies data signals to data lines, a scan driver that sequentially supplies scan signals to scan lines, an emission driver that supplies light emitting signals to light emitting control lines, and a pixel unit that includes a plurality of pixels coupled to the data lines, the scan lines, and the light emitting lines.

The pixels included in the pixel unit are selected, when the scan signals are supplied to the scan lines, to be supplied with the data signals from the data lines. The pixels supplied with the data signals illuminate, while generating light having a predetermined brightness corresponding to the data signals. Herein, the light emitting time of the pixels is controlled by the light emitting control signals supplied from the light emitting control lines. In general, the light emitting control signals are supplied while the data signals are supplied to the pixels, to set the pixels as a non-light emitting state.

Herein, in order for the organic light emitting display to be stably driven, the light emitting control signals should be supplied for an initial driving period before the pixels of the pixel unit normally emits light to set the pixels as a non-light emitting state. However, an output of a conventional emission driver is set as an unknown state during an initial driving period thereof. In other words, during the initial driving period, the light emitting control signals are supplied to some light emitting control lines, and the light emitting control signals are not supplied to the other light emitting control lines. Herein, light emitting is generated in some pixels coupled to the light emitting control lines not supplied with the light emitting control signals, and a problem arises that quality is, accordingly, deteriorated.

SUMMARY OF CERTAIN INVENTIVE ASPECTS

One aspect is an emission driver including a plurality of stages each coupled to one of a plurality of light emitting control lines. Each stage comprises an input unit configured to supply one of a first signal and a second signal to a first node, an output unit configured to output voltage at a first level when the second signal is input to the first node and to output voltage at a second level when the first signal is input to the first node and an initial driving controller that supplies the second signal to the first node during an initial driving period.

Another aspect is an organic light emitting display. The display includes a pixel unit including a plurality of pixels positioned near intersection portions of light emitting control lines, scan liens, and data lines, a scan driver configured to drive the scan lines, a data driver configured to drive the data lines, and an emission driver including a plurality of stages coupled to the light emitting control lines in order to drive the light emitting control lines. Each stage includes an input unit configured to supply one of a first signal and a second signal to a first node, an output unit configured to output a light emitting control signal at a first level when the second signal is input to the first node and to output the light emitting control signal at a second level when the first signal is input to the first node, and an initial driving controller configured to supply the second signal to the first node during an initial driving period.

BRIEF DESCRIPTION OF THE DRAWINGS

The accompanying drawings, together with the specification illustrate exemplary embodiments, and, together with the description, serve to explain certain inventive principles.

DETAILED DESCRIPTION OF CERTAIN INVENTIVE EMBODIMENTS

Figure 1:
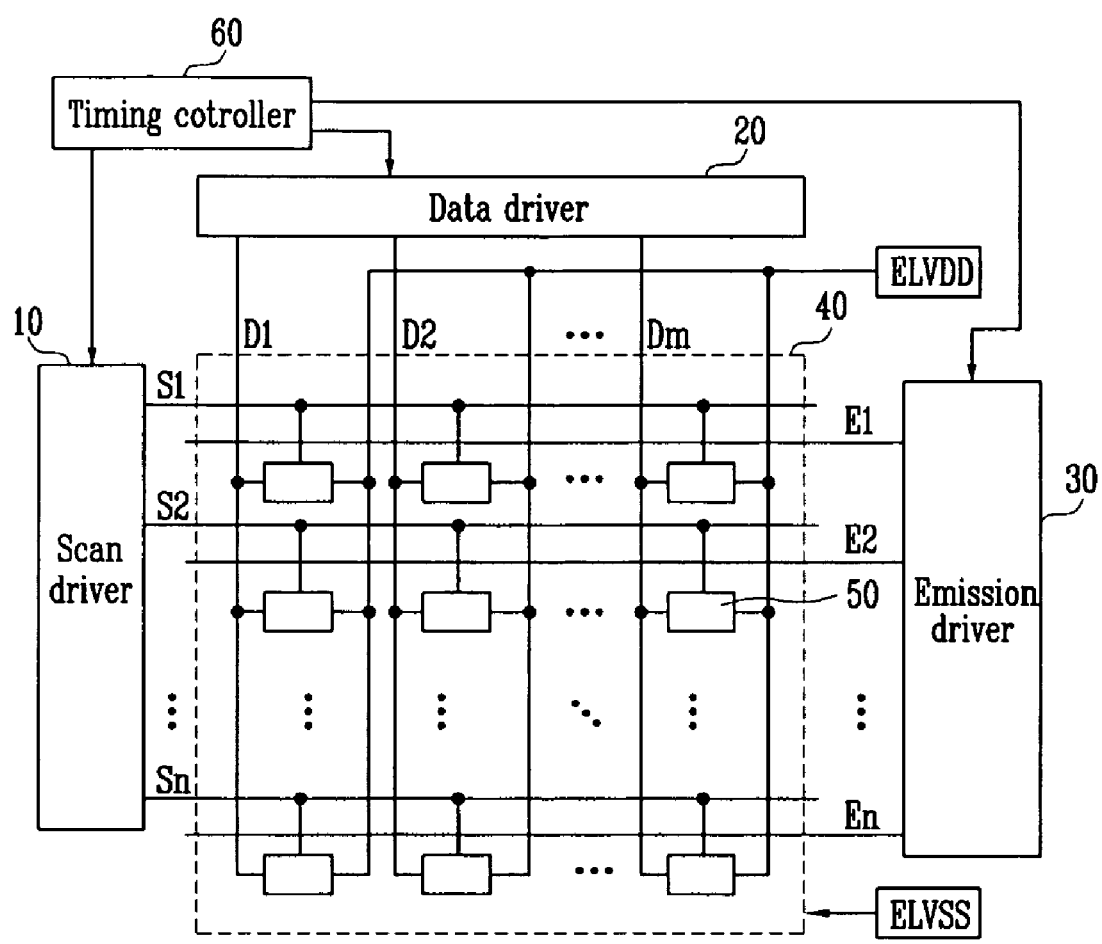
FIG. 1 illustrates an organic light emitting display according to an embodiment.

Hereinafter, certain exemplary embodiments will be described with reference to the accompany drawings. Herein, when a first element is described as being coupled to a second element, the first element may be not only directed coupled to the second element but may be also be indirectly coupled to the second element via a third element. Further, some of the elements that are not essential to the complete understanding of the invention are omitted for clarity. Also, like reference numerals generally refer to like elements throughout.

Hereinafter, embodiments which can carried out by those skilled in the art, will be described with reference to the accompanying FIGS. 1 to 7.

FIG. 1 illustrates an organic light emitting display according to one embodiment. In FIG. 1, although a scan driver 10 and an emission driver 30 are illustrated as separated from each other, the emission driver 30 may be included in the scan driver 10.

Referring to FIG. 1, the organic light emitting display includes: a pixel unit 40 including a plurality of pixels coupled to scan lines S1 to Sn, data lines D1 to Dm, and light emitting control lines E1 to En, a scan driver 10 that drivers the scan lines S1 to Sn, a data driver 20 that drives the data lines D1 to Dm, an emission driver 30 that drives the light emitting control lines E1 to En, and a timing controller 60 that controls the scan driver 10, the data driver 20, and the emission driver 30.

The scan driver 10 sequentially supplies scan signals to the scan lines S1 to Sn, while being controlled by the timing controller 60. As a result, pixels 50 coupled to the scan lines S1 to Sn are sequentially selected.

The data driver 10 supplies data signals to the data lines D1 to Dm, while being controlled by the timing controller 60. The data driver 20 supplies the data signals to the data lines D1 to Dm while the scan signals are supplied. As a result, the data signals are supplied to the selected pixels 50 by the scan signals, and the pixels 50 each are charged with voltage corresponding to the data signals supplied thereto.

The emission driver 30 sequentially supplies light emitting control signals to the light emitting control lines E1 to En, while being controlled by the timing controller 60. For example, the emission driver 30 supplies the light emitting control signals so that the pixels 50 do not emit light during the period that the data signals are being supplied to each pixel 50. The emission driver 30 supplies the light emitting control signals to the light emitting control lines E1 to En during an initial driving period that power is supplied to the emission driver 30, to set the pixels 50 to a non-light-emitting state. If the pixels are set to a non-light-emitting state during the initial driving period, the deterioration of display quality due to abnormal light emitting can be prevented.

The pixel unit 40 includes a plurality of pixels 50 arranged in a matrix. The respective pixels 50 supply current corresponding to the data signals to a second power supply ELVSS from a first power supply ELVDD via an organic light emitting diode (not shown) to generate light having a brightness corresponding to the current. Pixels 50 are set as a non-light-emitting state when the light emitting signals are supplied thereto.

Figure 2:
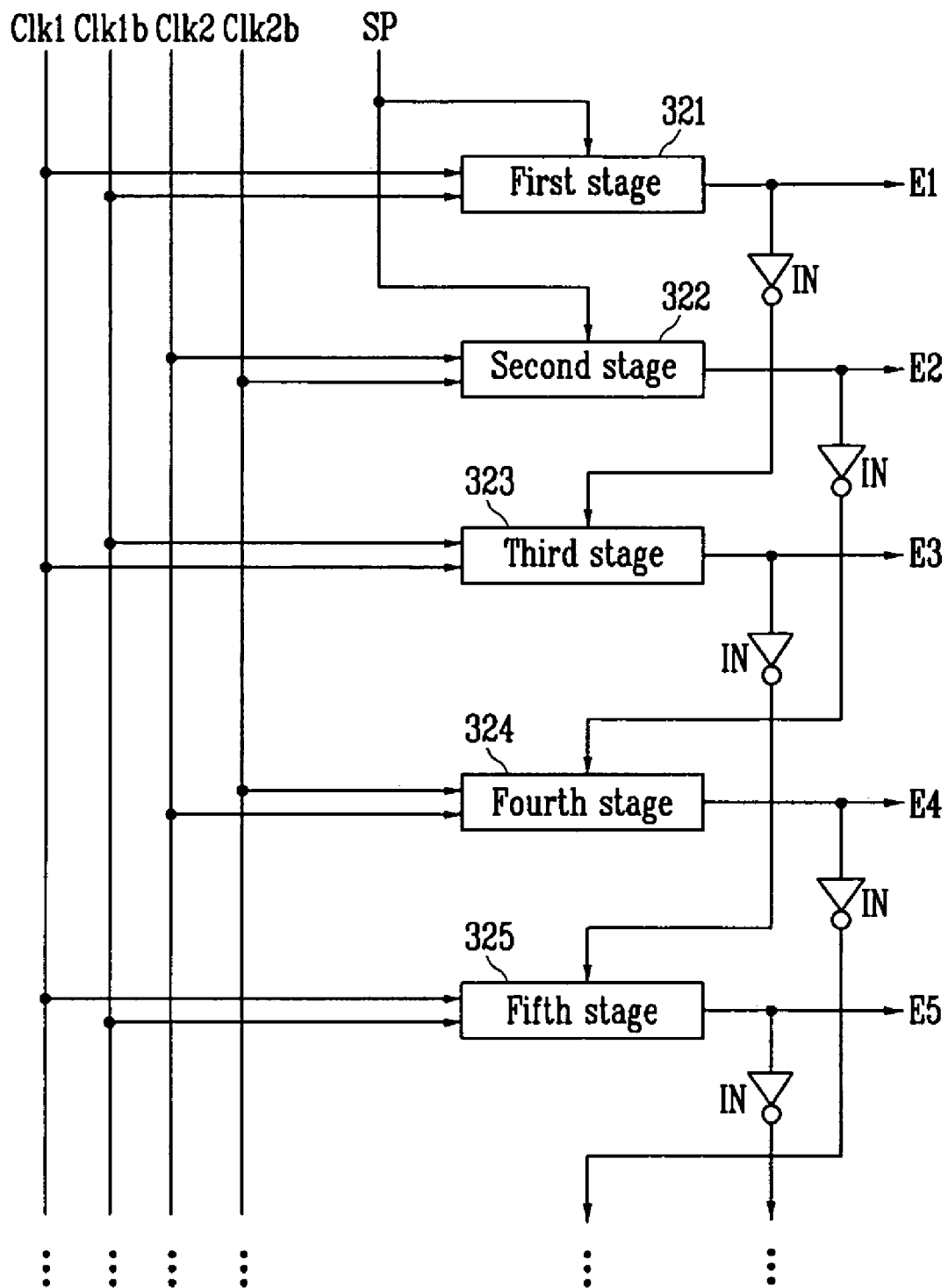
FIG. 2 illustrates the emission driver of FIG. 1.

FIG. 2 is a schematic view showing the emission driver of FIG. 1.

Referring to FIG. 2, an emission driver 30 of the present invention includes stages 321, 322, . . . coupled to respective light emitting control signals E1 to En. The respective stages 321, 322, . . . are driven by two clock signals.

Figure 3:
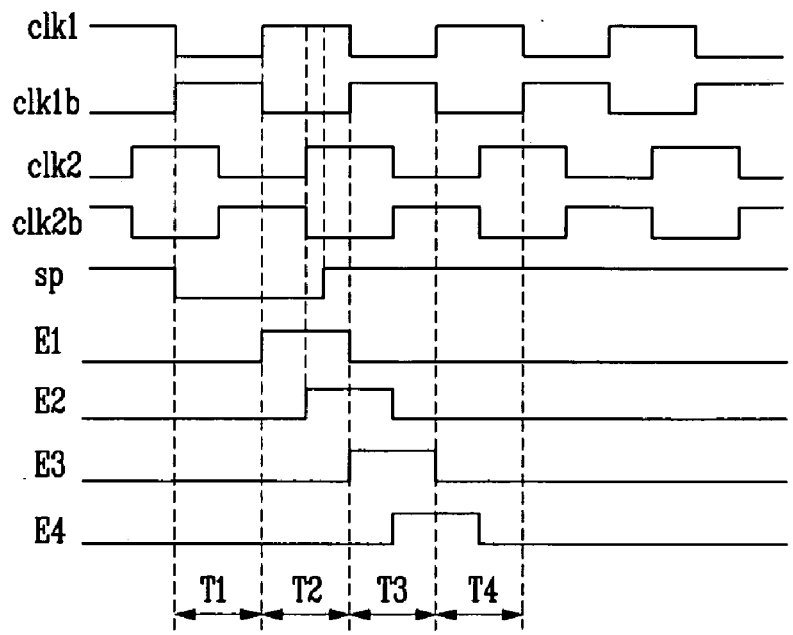
FIG. 3 is a waveform view showing a normal driving process of a stage of an emission driver.

Timing controller 60 supplies four clock signals Clk1, Clk1$b$, Clk2, and Clk2$b$ and starting signals SP to the emission driver 30. The first clock signal Clk1 and the inverted first clock signal Clk1$b$ are supplied to odd stages 321, 323, 325 . . . , and the second clock signal Clk2 and the inverted second clock signal Clk2$b$ are supplied to even stages 322, 324, . . . . The starting signals SP are supplied to the first stage 321 and the second stage 322. Herein, as shown in FIG. 3, the first clock signal Clk1 and the second clock signal Clk2 have the same period and are supplied to be overlapped by ¼ periods at their high levels (or low levels).

An output of an $i^{th}$ (i is a natural number) stage 32$i$ is supplied to an i+2$^{nd}$ stage 32$i$+2 via an inverter IN. For example, the output of a first stage 321 is supplied to the third stage 323 via the inverter IN, and the output of the third stage 323 is supplied to the fifth stage 325 via the inverter IN. Accordingly, the odd stages 323, 325, . . . are supplied with the output of odd stages. The output of the second stage 322 is supplied to the fourth stage 324 via the inverter IN, and the output of the fourth stage 324 is supplied to the sixth stage via the inverter IN. Accordingly, the even stages 324, . . . are supplied with the output of even stages.

Figure 4:
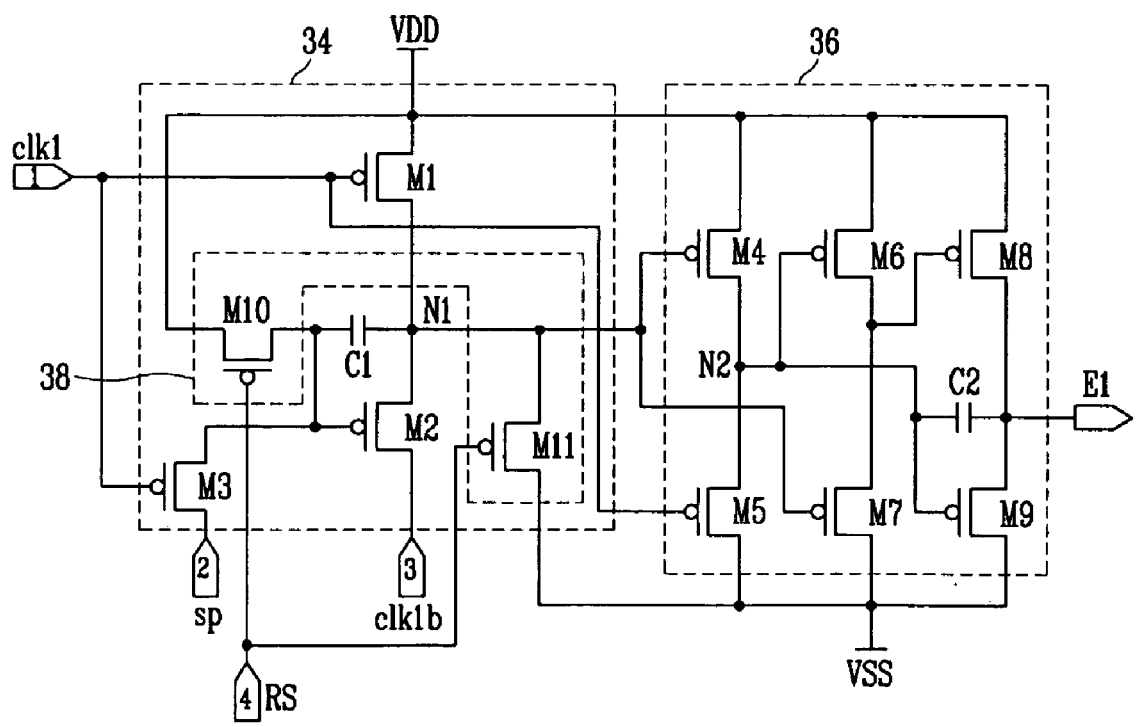
FIG. 4 is a circuit view showing a stage of FIG. 2 in detail.

FIG. 4 illustrates an embodiment of a circuit for the respective stages. For convenience, a first stage 321 coupled to a first clock signal Clk1 and an inverted first clock signal Clk1$b$ will be described in FIG. 4.

Referring to FIG. 4, a first stage 321 includes an input unit 34 that supplies any of a first signal and a second signal according to clock signals Clk1 and Clk1$b$ and stating signals SP, an output unit 36 that controls whether light emitting control signals are generated or not according to the first signal or the second signal supplied from the input unit 34, and an initial driving controller 38 that controls the light emitting signals to be suppliable during an initial driving period.

The input unit 34 includes a first transistor M1 coupled to a third power supply VDD and a first input terminal, a third transistor M3 coupled to the first input terminal and a second input terminal, a second transistor M2 coupled to the third transistor M3 and a third input terminal, and a first capacitor C1 coupled between a gate electrode of the second transistor M2 and a first electrode (source electrode) thereof.

A first electrode of the first transistor M1 is coupled to the third power supply VDD and a gate electrode thereof is coupled to the first input terminal. Herein, the first input terminal is a terminal supplied with the first clock signal clk1. A second electrode (drain electrode) of the first transistor M1 is coupled to a first node N1. The first transistor M1 is turned on when the first clock signal Clk1 is at a low level, to supply voltage of the third power supply VDD to the first node N1.

A first electrode of the second transistor M2 is coupled to the first node N1, and a second electrode thereof is coupled to the third input terminal. Herein, the third input terminal is supplied with the inverted first clock signal clk1$b$. A gate electrode of the second transistor M2 is coupled to a first electrode of the third transistor M3. As described above, the second transistor M2 is turned on or turned off according to the voltage charged in the first capacitor C1.

The first electrode of the third transistor M3 is coupled to the gate electrode of the second transistor M2, and a second electrode thereof is coupled to the second input terminal. The second input terminal is supplied with the starting signals SP or light emitting control signals inverted from a previous stage. A gate electrode of the third transistor M3 is coupled to the first input terminal. The third transistor M3 is turned on when the first clock signal Clk1 is at a low level.

The first capacitor C1 is coupled to the gate electrode of the second transistor M2 and the first electrode thereof. The first capacitor C1 is charged with voltage, which can turn on the second transistor M2 when the third transistor M3 is turned on and the starting signals SP are supplied to the second input terminal. It is not charged with voltage otherwise.

The output unit 36 outputs the light emitting signals (high level) in the case where the second signals (low level) are supplied to the first node N1, and it does not output the light emitting signals in other case (that is, when the first signal (high level) is supplied to the first node N1).

To this end, the output unit 36 includes a fourth transistor M4 coupled to the third power supply VDD, a sixth transistor M6, an eighth transistor M8, a fifth transistor M5 coupled to a fourth power supply VSS, a seventh transistor M7, a ninth transistor M9, and a second capacitor C2 coupled between a gate electrode of the ninth transistor M9 and a first electrode thereof.

A first electrode of the fourth transistor M4 is coupled to the third power supply VDD, and a second electrode thereof is coupled to the second node N2. A gate electrode of the fourth transistor M4 is coupled to the first node N1.

A first electrode of the fifth transistor M5 is coupled to the second node N2, and a second electrode thereof is coupled to the fourth power supply VSS. A gate electrode of the fifth transistor M5 is coupled to the first input terminal.

A first electrode of the sixth transistor M6 is coupled to the third power supply VDD, and a second electrode thereof is coupled to a first electrode of the seventh transistor M7. A gate electrode of the sixth transistor M6 is coupled to the second node N2.

The first electrode of the seventh transistor M7 is coupled to the second electrode of the sixth transistor M6, and a second electrode thereof is coupled to the fourth power supply VSS. A gate electrode of the seventh transistor M7 is coupled to the first node N1.

A first electrode of the eighth transistor M8 is coupled to the third power supply VDD, and a second electrode thereof is coupled to the light emitting control line E1. A gate electrode of the eighth transistor M8 is coupled to the second electrode of the sixth transistor M6.

A first electrode of the ninth transistor M9 is coupled to the light emitting control line E1, and a second electrode thereof is coupled to the fourth power supply VSS. The gate electrode of the ninth transistor M9 is coupled to the second node N2.

The second capacitor C2 is coupled between the gate electrode of the ninth transistor M9 and the first electrode thereof. The second capacitor C2 controls a turn-on and a turn-off of the ninth transistor M9.

The initial driving controller 38 controls the light emitting control signals to be supplied to the light emitting control line E1 during an initial driving period. The initial driving controller 38 is driven during the initial driving period and not driven during a normal driving period that the pixels 50 are driven. The initial driving controller 38 includes a tenth transistor M10 and an eleventh transistor M11.

A first electrode of the tenth transistor M10 is coupled to the third power supply VDD, and a second electrode thereof is coupled to the gate electrode of the second transistor M2. A gate electrode of the tenth transistor M10 is coupled to a fourth input terminal input with initial control signals RS (active low level signal). The a tenth transistor M10 is turned on when the initial control signals RS are supplied, and is turned off when the initial control signals RS are not supplied. In this embodiment, the input unit 34, the output unit 36, and the initial driving controller 38 use only the same type of transistors, pMOS transistors. In other embodiments other transistors may be used, or multiple types may be used.

A first electrode of the eleventh transistor M1 is coupled to the first node N1, and a second electrode thereof is coupled to the fourth power supply VSS. A gate electrode of the eleventh transistor M1 is coupled to the fourth input terminal. The eleventh transistor M11 is turned on when the initial control signals are supplied, and is turned off when the initial control signals are not supplied.

FIG. 3 is a waveform view showing a normal driving process of a stage during a normal driving period. During the normal driving period, the tenth transistor M10 and the eleventh transistor M11 maintain in a turn-off state.

Figure 5A:
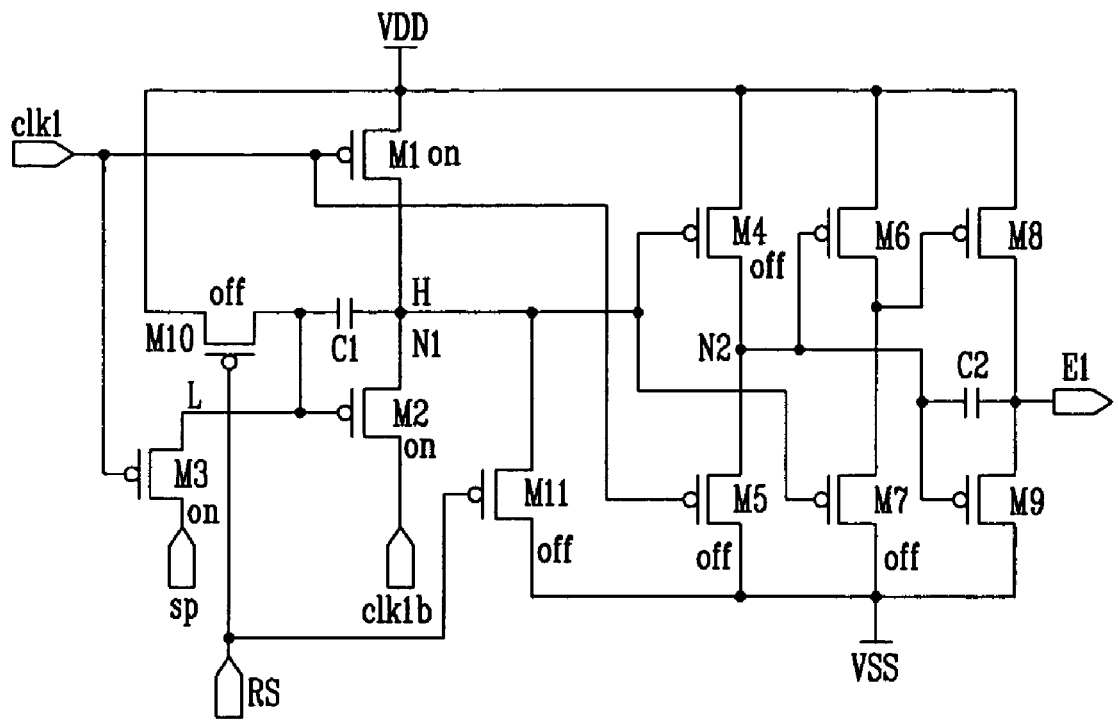
FIGS. 5a to 5d are circuit views showing an operation process of a stage by the waveform view of FIG. 3.

With reference to FIGS. 3 and 4, first a clock signal Clk1 is set as a low level and an inverted first clock signal Clkb1 is set as a high level during a first period T1. In this case, as shown in FIG. 5a, a first transistor M1 and a third transistor M3 are turned on by the first clock signal Clk1.

Because the first transistor M1 is on, the voltage of a first node N1 rises to the voltage of a third power supply VDD. Accordingly, the voltage of a first signal (high level) is applied to the first node N1. Because the third transistor M3 is turned on, the gate electrode voltage of the second transistor M2 falls to a low level because of the starting signal SP supplied during the first period T1. In this case, the first capacitor C1 is charged with a voltage of a difference between the voltage of the third power supply VDD applied to the first node N1 and the low level voltage applied to a gate electrode of a second transistor M2.

Because the second transistor M2 is turned on, the voltage of the inverted first clock signal Clk1b is supplied to the first node N1. Herein, a voltage level of the inverted first clock signal Clk1b is set as a high level. For example, the high level voltage of the inverted first clock signal Clk1b may be set to be the same as the voltage of the third power supply VDD. Then, even when the first transistor M1 and the second transistor M2 are simultaneously turned on, the voltage of the first node N1 can be stably maintained at the same high level.

When the voltage of the first signal is applied to the first node N1, a fourth transistor M4 and a seventh transistor M7 are turned off. Meanwhile, although the first clock signal Clk1 maintains a low level, a fifth transistor M5 maintains a turn-off state because of the voltage stored in a second capacitor C2. (The charging process of voltage in the second capacitor C2 will be described later.) The second capacitor C2 is charged with voltage of more than VDD−(VSS+|$V_{th5}$|). Therefore, voltage of a first electrode of the fifth transistor M5 is less than |$V_{th5}$| higher than the voltage of the first clock signal Clk1 and accordingly, the fifth transistor M5 maintains a turn-off state.

Figure 5B:
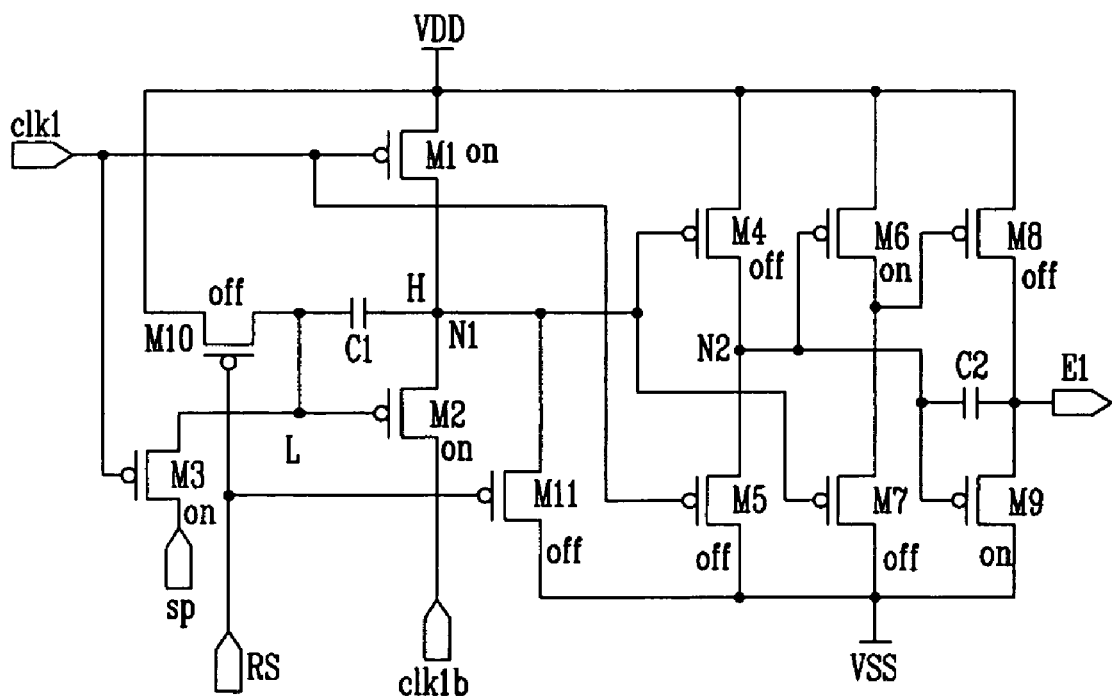

The sixth transistor M6 is turned on by voltage applied to a second node N2 (that is, voltage because of the second capacitor C2), as shown in FIG. 5b. When the sixth transistor M6 is turned on, the voltage of the third power supply VDD is supplied to the gate electrode of the eighth transistor M8. Accordingly, the eighth transistor M8 is off.

The ninth transistor M9 maintains a turn-on state because of the voltage charged in the second capacitor C2 and accordingly, the light emitting control line E maintains output voltage of a fourth power supply VSS. Herein, the second capacitor C2 is charged with voltage of more than VDD−(VSS+|$V_{th5}$|) so that voltage of the light emitting control line E is pulled-down to the voltage of the fourth power supply VSS.

Thereafter, during a second period T2, the first clock signal Clk1 is set as a high level and the inverted clock signal Clk1b is set as a low level.

Figure 5C:
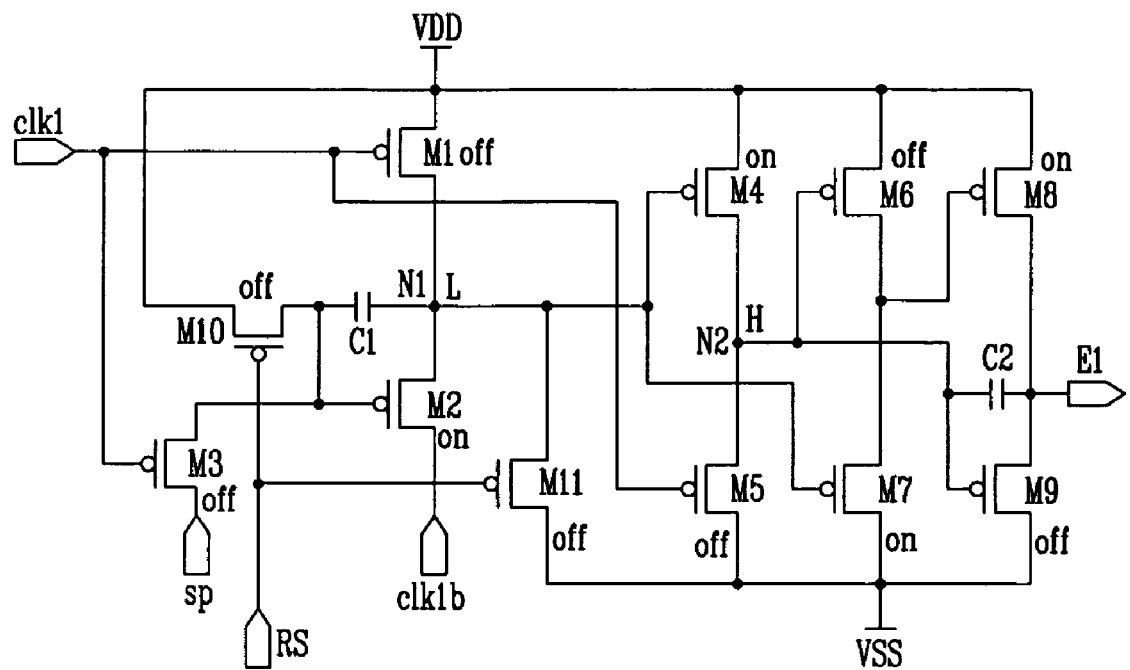

Because the first clock signal Clk1 is set as a high level, the first transistor M1, the third transistor M3, and the fifth transistor M5 are turned off, as shown in FIG. 5c. The second transistor M2 is still on because of the voltage charged in the first capacitor C1 during a previous period. Because the second transistor M2 is on, the voltage of the first node N1 falls to a level of the inverted first clock signal Clk1b (for example, the fourth power supply VSS), that is, a low level.

Because the voltage of a second signal (low level) is applied to the first node N1, the fourth transistor M4 and the seventh transistor M7 are turned on. Because the fourth transistor M4 is turned on, the voltage of the second node N2 rises to the voltage of the third power supply VDD. As a result, the sixth transistor M6 and the ninth transistor M9 are turned off. Because the seventh transistor M7 is on, the voltage of the gate electrode of the eighth transistor M8 falls to the voltage of the fourth power supply VSS so that the eighth transistor M8 is turned on. Because the eighth transistor M8 is on, the voltage of the third power supply VDD is supplied to the light emitting control line E1. Accordingly, during the second period T2, the light emitting control signals are supplied to the light emitting control line E1. During the second period T2, the voltage of the third power supply VDD is supplied across the second capacitor C2 so that the second capacitor C2 is not charged with voltage.

During a third period T3, the first clock signal Clk1 is set as a low level, and the inverted first clock signal Clk1b is set as a high level.

Figure 5D:
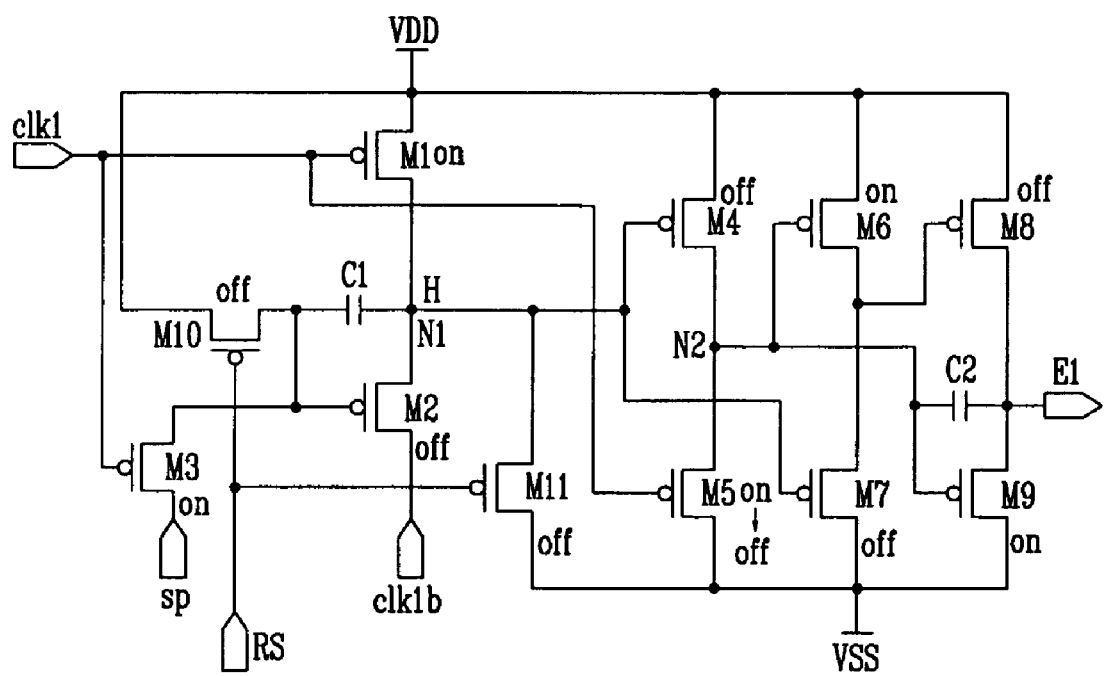

Accordingly, during the third period T3, the first transistor M1, the third transistor M3, and the fifth transistor M5 are turned on by the first clock signal Clk1, as shown in FIG. 5d. Because the first transistor M1 is turned on, the voltage of the first node N1 rises to the voltage of the third power supply VDD. In other words, the voltage of the first signal (high level) is-applied to the first node N1.

Because the third transistor M3 is turned on, and the starting signals SP maintains voltage at high level (for example, the voltage of the third power supply VDD), the second transistor M2 is off. The voltage at both terminals of the first capacitor C1 are the voltage of the third power supply VDD so that the first capacitor C1 is not charged. In this embodiment, the first capacitor C1 is charged with a predetermined voltage only in the period where the starting signals SP are set as a low level, and is not charged with voltage otherwise.

The second transistor M2 is turned off, the voltage of the first signal is applied to the first node N1, and the inverted first clock signal Clk1b maintains a high level. Therefore, although the first node N1 maintains the voltage of the first signal, current is prevented from flowing via the second transistor M2 and power consumption is therefore reduced.

When the fifth transistor M5 is on, the voltage of the second node N2 is pulled down to voltage of VSS+|$V_{th5}$|. (|$V_{th5}$| is threshold voltage of the fifth transistor M5). After the voltage of the second node N2 is pulled-down to the voltage of VSS+|$V_{th5}$|, the fifth transistor M5 is switched into a turn-off state. Accordingly, the second capacitor C2 is charged with the voltage of more than of VDD−(VSS+|$V_{th5}$|) because of the voltage of VSS+|$V_{th5}$| applied to the second node N2 and the third power VDD applied to the light emitting control line E1.

The fourth transistor M4 and the seventh transistor M7 are turned off by the voltage of the first signal applied to the first node N1, and the sixth transistor M6 and the ninth transistor M9 are turned on by the voltage charged in the second capacitor C2.

Because the sixth transistor is turned on, the voltage of the third power supply VDD is applied to the gate electrode of the eighth transistor M8 so that the eighth transistor M8 is turned off. Because the ninth transistor M9 is on, the voltage of the light emitting control line D1, maintaining a high state during the second period T2, falls to the voltage of the fourth power supply VSS. At this time, the fifth transistor is set as a turn-off state (accordingly, N2 is in a floating state) so that the voltage charged in the second capacitor C2 is maintained and accordingly, the voltage of the light emitting control line E1 is pulled down to the voltage of the fourth power supply VSS.

Thereafter, the voltage of only the first signal (high level) is applied to the first node N1 before the starting signals SP are supplied again. In other words, the first capacitor C1 is not charged with voltage before the starting signals SP are supplied again, and accordingly the second transistor M2 maintains a turn-off state. As a result, the ninth transistor M9 supplies the voltage of the fourth power supply VSS to the light emitting control line E1 during the remainder of the frame period, because of the voltage charged in the second capacitor C2.

Figure 6:
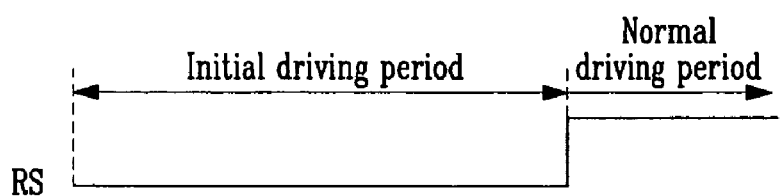
FIG. 6 is a waveform view showing an initial control signal supplied during an initial driving period.

FIG. 6 illustrates an initial control signal supplied during an initial driving period.

Referring to FIG. 6, an initial control signal RS (low level) is supplied during an initial driving period and the initial control signal RS is not supplied during a normal driving period.

Figure 7:
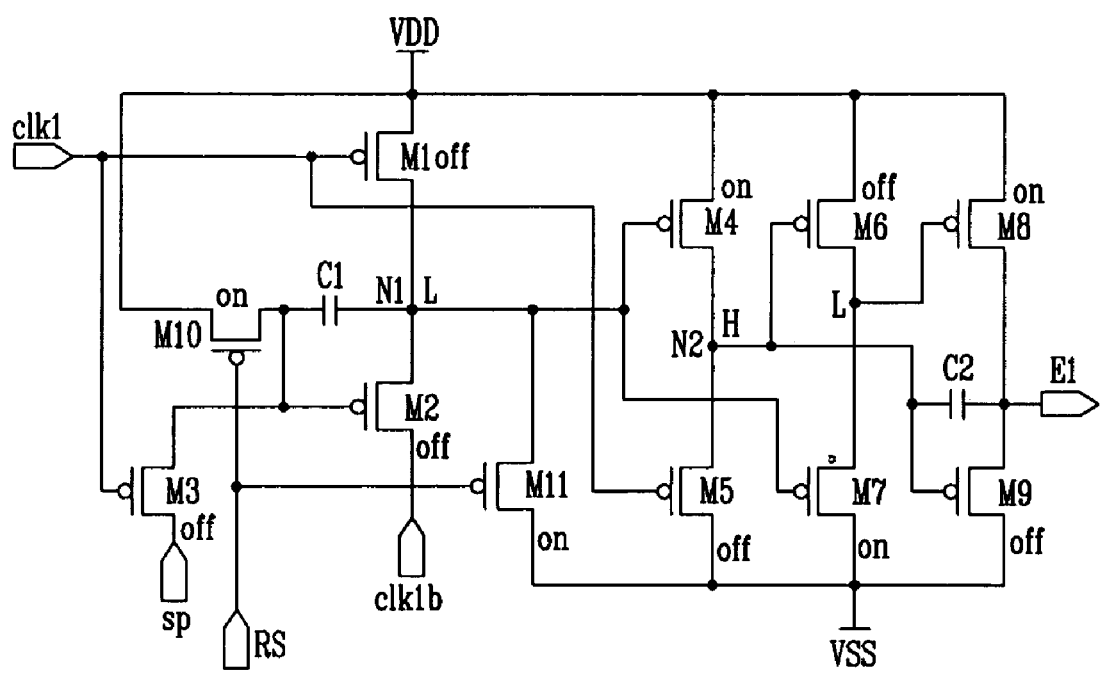
FIG. 7 is a circuit view showing an operation process of a stage by the waveform view of FIG. 6.

Because the initial control signal RS is supplied during the initial driving period, the tenth transistor M10 and the eleventh transistor M11 are turned on, as shown in FIG. 7. Because the tenth transistor M10 is on, the voltage of a third power supply VDD is supplied to the gate electrode of the second transistor M2 and accordingly, the second transistor M2 is turned off.

Because the eleventh transistor M11 is on, the voltage of the fourth power supply VSS is supplied to the first node N1. In other words, a second signal is supplied to the first node N1. Because the second signal is supplied to the first node N1, the fourth transistor M4 and the seventh transistor M7 are turned on.

Because the fourth transistor M4 is turned on, the voltage of the third power supply VDD is supplied to a second node N2 so that a sixth transistor M6 is turned off. Because the seventh transistor M7 is turned on, the voltage of the fourth power supply VSS is supplied to the gate electrode of the eighth transistor M8 so that the eighth transistor M8 is turned on. Because the eight transistor M8 is turned on, the voltage of the third power supply VDD is supplied to the light emitting control line E1.

As described above, during the initial driving period, the initial driving controller 38 is controlled to supply the light emitting control signals to the all light emitting control lines E1 to En. Then, light emitting of the pixels 50 during the initial driving period can be prevented, making it possible to improve display quality.

While the certain exemplary embodiments have been described, it is to be understood that the invention is not limited to the disclosed embodiments, but, on the contrary, is intended to cover various modifications and equivalent arrangements.

What is claimed is:

1. An emission driver comprising:
    a plurality of stages each coupled to one of a plurality of light emitting control lines, wherein each stage comprises:
        an input unit configured to supply one of a first signal and a second signal to a first node according to one or more control signals received from one or more control input terminals during a non-initial driving period;
        an output unit configured to output voltage at a first level when the second signal is input to the first node and to output voltage at a second level when the first signal is input to the first node; and
        an initial driving controller configured to supply the second signal to the first node during an initial driving period in response to an initial control signal received from an initial control input terminal, wherein the initial control input terminal is distinct from the control input terminals.

2. The emission driver as claimed in claim 1, wherein the first level is a voltage level higher than the voltage of the second level.

3. The emission driver as claimed in claim 1, wherein the input unit comprises:
    a first transistor coupled between a third power supply and a first node, wherein the first transistor has a gate electrode coupled to a first input terminal;
    a second transistor coupled between the first node and a third input terminal;

a first capacitor coupled between a gate electrode of the second transistor and a first electrode of the second transistor; and a third transistor coupled between the gate electrode of the second transistor and a second input terminal and having a gate electrode coupled to the first input terminal.

4. The emission driver as claimed in claim 3, wherein the first input terminal is supplied with a first clock signal, and the third input terminal is input with an inverted first clock signal.

5. The emission driver as claimed in claim 3, wherein the second input terminal is input with an output signal or a starting signal of a previous stage.

6. The emission driver as claimed in claim 3, wherein the initial driving controller comprises:

a tenth transistor coupled between a gate electrode of the second transistor and the third power supply and having a gate electrode coupled to a fourth power supply; and an eleventh transistor coupled between the first node and a fourth power supply and having a gate electrode coupled to the initial control input terminal, wherein the fourth power supply is at a lower voltage than the third power supply.

7. The emission driver as claimed in claim 6, wherein the initial control input terminal is supplied with the initial control signal so that the tenth transistor and the eleventh transistor can be turned on during the initial driving period.

8. The emission driver as claimed in claim 6, wherein the initial driving controller supplies the voltage of the fourth power supply to the first node during the initial driving period.

9. The emission driver as claimed in claim 1, wherein the output unit comprises:

a fourth transistor, a sixth transistor and an eighth transistor each coupled to the third power supply, the third power supply being at a high level;

a fifth transistor between the fourth power supply and the fourth transistor, wherein the fourth power supply has a lower voltage than the third power supply;

a seventh transistor between the fourth power supply and the sixth transistor;

a ninth transistor between the fourth power supply and the eighth transistor; and a second capacitor between a gate electrode of the ninth transistor and a first electrode of the ninth transistor.

10. The emission driver as claimed in claim 1, wherein the each stage comprises only a single type of transistor.

11. An organic light emitting display, comprising:

a plurality of scan lines and data lines, and light emitting control lines;

a pixel unit including a plurality of pixels connected to the scan lines, data lines, and light emitting control lines;

a scan driver configured to drive the scan lines;

a data driver configured to drive the data lines; and an emission driver including a plurality of stages coupled to the light emitting control lines in order to drive the light emitting control lines, wherein each stage comprises:

an input unit configured to supply one of a first signal and a second signal to a first node according to one or more control signals received from one or more control input terminals during a non-initial driving period;

an output unit configured to output a light emitting control signal at a first level when the second signal is input to the first node and to output the light emitting control signal at a second level when the first signal is input to the first node; and an initial driving controller configured to supply the second signal to the first node during an initial driving period in response to an initial control signal received from an initial control input terminal, wherein the initial control input terminal is distinct from the control input terminals.

12. The organic light emitting display as claimed in claim 11, wherein the first level is a voltage level higher than the voltage of the second level.

13. The organic light emitting display as claimed in claim 11, wherein the input unit comprises:

a first transistor coupled between a third power supply and a first node and having a gate electrode coupled to a first input terminal;

a second transistor coupled between the first node and a third input terminal;

a first capacitor coupled between a gate electrode of the second transistor and a first electrode thereof; and a third transistor coupled between the gate electrode of the second transistor and a second input terminal and having a gate electrode coupled to the first input terminal.

14. The organic light emitting display as claimed in claim 13, wherein the first input terminal is supplied with a first clock signal, and the third input terminal is input with an inverted first clock signal.

15. The organic light emitting display as claimed in claim 13, wherein the second input terminal is input with an output signal or a starting signal of a previous stage.

16. The organic light emitting display as claimed in claim 13, wherein the initial driving controller comprises:

a tenth transistor coupled between a gate electrode of the second transistor and the third power supply and having a gate electrode coupled to a fourth power supply; and an eleventh transistor coupled between the first node and a fourth power supply and having a gate electrode coupled to the initial control input terminal, wherein the fourth power supply has a lower voltage than that of the third power supply.

17. The organic light emitting display as claimed in claim 16, wherein the initial control input terminal is supplied with the initial control signal so that the tenth transistor and the eleventh transistor can be turned on during the initial driving period.

18. The organic light emitting display as claimed in claim 16, wherein the initial driving controller is configured to supply the voltage of the fourth power supply to the first node during the initial driving period.

19. The organic light emitting display as claimed in claim 11, wherein the output unit comprises:

a fourth transistor, a sixth transistor and an eighth transistor each coupled to the third power supply;

a fifth transistor between the fourth power supply and the fourth transistor;

a seventh transistor between the fourth power supply and the sixth transistor;

a ninth transistor between the fourth power supply and the eighth transistor; and a second capacitor formed between a gate electrode of the ninth transistor and a first electrode thereof, wherein the fourth power supply has a voltage higher than the third power supply.

20. The emission driver as claimed in claim 11, wherein the each stage comprises only a single type of transistor.

* * * * *